United States Patent [19]
Wu

[11] Patent Number: 6,110,767
[45] Date of Patent: Aug. 29, 2000

[54] REVERSED MOS

[75] Inventor: Shu-Fang Wu, Taipei, Taiwan

[73] Assignee: Vanguard International Semiconductor Corporation, Hsin-Chu, Taiwan

[21] Appl. No.: 09/116,611

[22] Filed: Jul. 16, 1998

[51] Int. Cl.[7] .......................... H01L 21/00; H01L 21/336
[52] U.S. Cl. ........................................... 438/158; 438/300
[58] Field of Search ..................................... 438/153, 158, 438/283, 300

[56] References Cited

U.S. PATENT DOCUMENTS

| | | | |
|---|---|---|---|
| 4,430,792 | 2/1984 | Temple | 29/571 |
| 4,685,196 | 8/1987 | Lee | 437/41 |
| 5,296,727 | 3/1994 | Kawai et al. | 257/260 |
| 5,441,900 | 8/1995 | Bulucea et al. | 437/24 |
| 5,451,534 | 9/1995 | Yang | 437/52 |
| 5,661,051 | 8/1997 | Yeh et al. | 438/158 |
| 5,736,435 | 4/1998 | Venkatesan et al. | 438/151 |
| 5,807,769 | 9/1998 | Dennison et al. | 438/300 |

OTHER PUBLICATIONS

S. Wolf, "Silicon Processing for the VLSI Era–vol. 2" Lattice Press, Sunset Beach, CA, 1990, p400–419.
Weste and Eshraghian, "Principles of CMOS VLSI Design", Addison–Wesley Publishing Company, Reading, MA, 1993, p 139–140.

*Primary Examiner*—Richard Booth
*Assistant Examiner*—Walter L. Lindsay, Jr.
*Attorney, Agent, or Firm*—George O. Saile; Stephen B. Ackerman; Rosemary L.S. Pike

[57] ABSTRACT

A new method for fabricating a reversed MOS structure in order to provide latchup immunity in the manufacture of integrated circuits is described. An active area is provided in a semiconductor substrate separated from other active areas by isolation regions. A dielectric layer is formed on the surface of the semiconductor substrate in the active area. A polysilicon layer is deposited overlying the dielectric layer and patterned. A mask is formed over a portion of the polysilicon layer in the active area. Ions are implanted into the polysilicon layer not covered by the mask to form implanted regions within the polysilicon layer and simultaneously form implanted regions within the substrate adjacent to the polysilicon layer wherein the implanted regions in the polysilicon layer form source and drain regions and wherein the polysilicon layer covered by the mask forms a channel region and wherein the implanted regions within the substrate diffuse together to form a gate electrode underlying the channel region.

24 Claims, 3 Drawing Sheets

REVERSED MOS

BACKGROUND OF THE INVENTION

(1) Field of the Invention

The invention relates to the fabrication of integrated circuit devices, and more particularly, to a method of preventing latchup and decreasing chip size in the manufacture of integrated circuits.

(2) Description of the Prior Art

In the fabrication of integrated circuit devices, it is desired to decrease chip size and increase device density. A problem that may occur is a difference in the threshold voltage between the source and the body, or gate, known as the body effect. An increase in the body effect can lead to latchup. Latchup is the condition in which a very low resistance path is established between the $V^{DD}$ and $V^{SS}$ power lines, allowing large currents to flow through the circuit. This may cause device malfunction or even destruction due to heat damage. For example, latchup is discussed in the book *Silicon Processing for the VLSI Era*, Volume 2, by Stanley Wolf, Lattice Press, Sunset Beach, Calif., c. 1990, pp. 400–419.

The bulk CMOS structure has an inherent pnp and npn parasitic bipolar junction transistor. Under certain conditions, such as overshoot of voltage, the lateral current in the well and substrate can cause a voltage drop, hence a forward bias in some junctions, causing a large current flow. Based on the theory, if the bulk of the devices can be fully separated from one another, this phenomena can be avoided.

U.S. Pat. No. 5,441,900 to Bulucea et al discloses ion implantation to suppress latchup. U.S. Pat. No. 5,451,534 to Yang teaches forming a gate electrode by ion implantation into a silicon substrate and source and drain regions formed in an overlying polysilicon layer. A similar thin film transistor is shown in FIG. 3. 23 in *Principles of CMOS VLSI Design*, by Weste and Eshraghian, Addison-Wesley Publishing Company, Reading, Mass., c. 1993, pp. 139–140.

SUMMARY OF THE INVENTION

A principal object of the present invention is to provide an effective and very manufacturable method of manufacturing a reversed MOS structure in the fabrication of integrated circuit devices.

A further object of the invention is to fabricate a reversed MOS structure within the CMOS process.

Another object is to increase device density and reduce chip size in the manufacture of integrated circuits.

Yet another object of the invention is to isolate transistors on substrates in order to provide latchup immunity.

Yet another object of the invention is to fabricate a reversed MOS structure in order to provide latchup immunity in the fabrication of integrated circuits.

In accordance with the objects of this invention a method for fabricating a reversed MOS structure in order to provide latchup immunity in the manufacture of integrated circuits is achieved. An active area is provided in a semiconductor substrate separated from other active areas by isolation regions. A dielectric layer is formed on the surface of the semiconductor substrate in the active area. A polysilicon layer is deposited overlying the dielectric layer and patterned. A mask is formed over a portion of the polysilicon layer in the active area. Ions are implanted into the polysilicon layer not covered by the mask to form implanted regions within the polysilicon layer and simultaneously form implanted regions within the substrate adjacent to the polysilicon layer wherein the implanted regions in the polysilicon layer form source and drain regions and wherein the polysilicon layer covered by the mask forms a channel region and wherein the implanted regions within the substrate diffuse together to form a gate electrode underlying the channel region.

BRIEF DESCRIPTION OF THE DRAWINGS

In the accompanying drawings forming a material part of this description, there is shown.

DESCRIPTION OF THE PREFERRED EMBODIMENTS

The FIGS. 1–6 illustrate an N channel MOSFET integrated circuit device. However, it is well understood by those skilled in the art that a P channel FET integrated circuit device could be formed by simply substituting opposite polarities to those given for the N channel embodiment. Also, in a similar way, a CMOSFET could be formed by making both N channel and P channel devices upon the same substrate.

Figure 1:
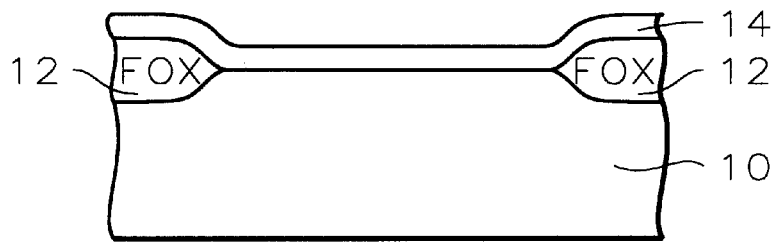
FIGS. 1 through 3 and 5 through 7 schematically illustrate in cross-sectional representation a preferred embodiment of the present invention.

Referring now more particularly to FIG. 1, there is shown an illustration of a portion of a partially completed integrated circuit device. The semiconductor substrate 10 is preferably composed of silicon having a (100) crystallographic orientation. In an effort to simplify the description and the drawings the dielectric isolation between devices has been only partially shown and will not be described in detail, because they are conventional. For example, field oxide regions 12 are formed to isolate the semiconductor surface regions shown from other such regions, not shown. A layer of gate oxide 14 is thermally grown or deposited over the surface of the substrate to a thickness of between about 60 and 150 Angstroms.

Figure 2:
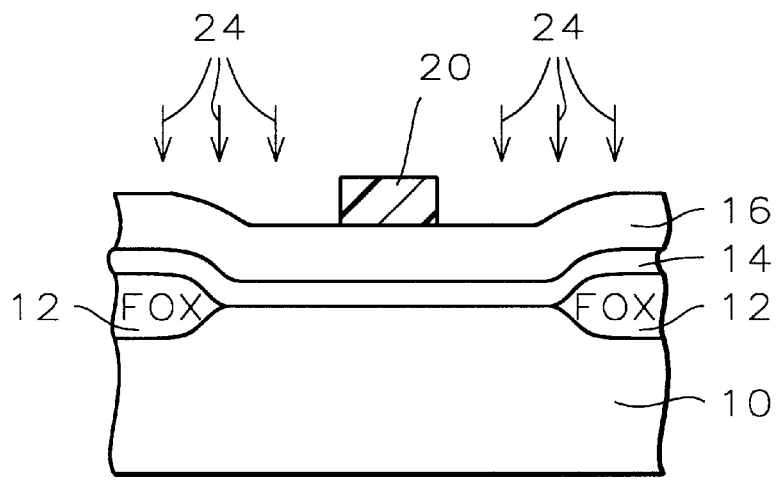

The source/drain structure of the reversed MOS FET may now be formed by the following steps. For a conventional MOSFET, the physical location in the Y direction is gate to oxide to substrate. In a reversed MOSFET, it is substrate to oxide to gate. Referring to FIG. 2, a layer of polysilicon 16 is deposited over the silicon oxide layer 14 to a thickness of between about 2000 and 4000 Angstroms. The polysilicon layer is patterned as shown in FIG. 2, in top view in FIG. 4 and in view 5—5 in FIG. 5.

Figure 5:
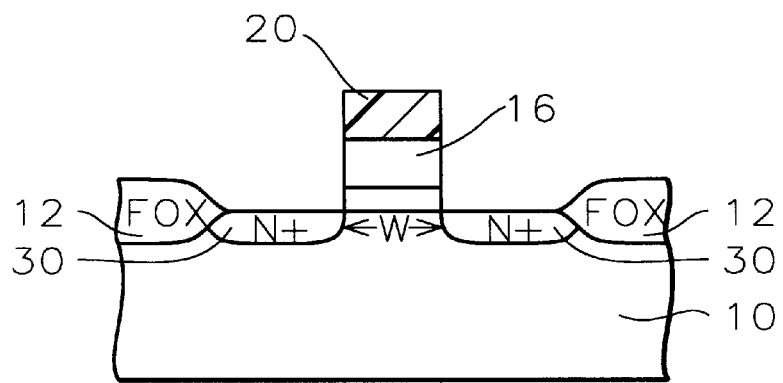

A photoresist mask 20 is formed over the polysilicon layer, as is conventional in the art, and as shown in FIG. 2 and FIG. 5. Source and drain regions 26 are formed by implanting ions 24 into the polysilicon layer 16 where it is not covered by the photoresist mask 20. At the same time, N+ regions 30 are implanted into the substrate not covered by the mask 20 as shown in FIG. 5. Arsenic or phosphorus ions are implanted at a dosage of between about 1 E 13 and 3 E 14 atoms/cm$^2$ at an energy of 30 to 50 KeV for As or 20 to 30 KeV for P to form N+ regions, as shown. To form P+ regions, boron or $BF_2$ ions are implanted at a dosage of between about 1 E 13 and 1 E 15 atoms/cm$^2$ at an energy of 20 to 30 KeV for boron or 30 to 70 KeV for $BF_2$.

Figure 3:
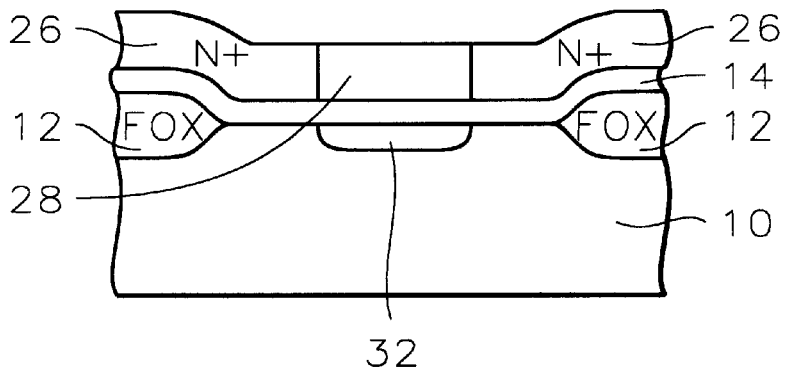

Referring to FIG. 3, the implanted regions 26 form source and drain regions while the undoped region 28 is the channel region.

Figure 4:
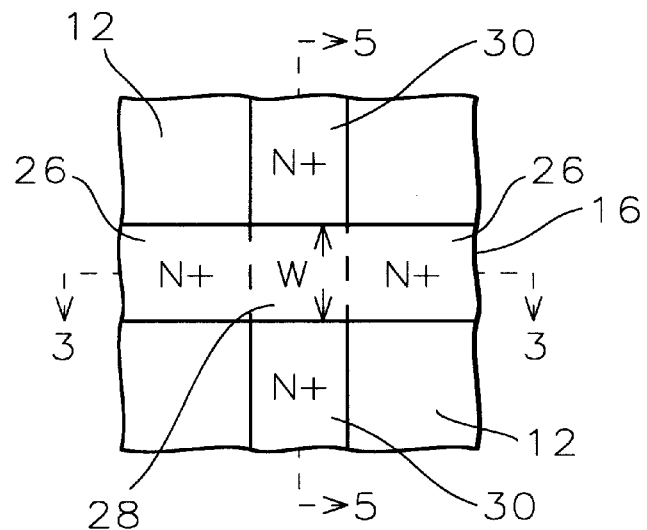
FIG. 4 schematically illustrates a top view of a preferred embodiment of the present invention.

FIG. 4 is a top view of the reversed MOS structure of the present invention. The view 3—3 of FIG. 4 has been shown in FIG. 3. The gate region is not fully covered by the implanted N+ regions 30, shown in FIG. 4. FIG. 5 is a cross-section of the view 5—5 of FIG. 4.

Figure 6:
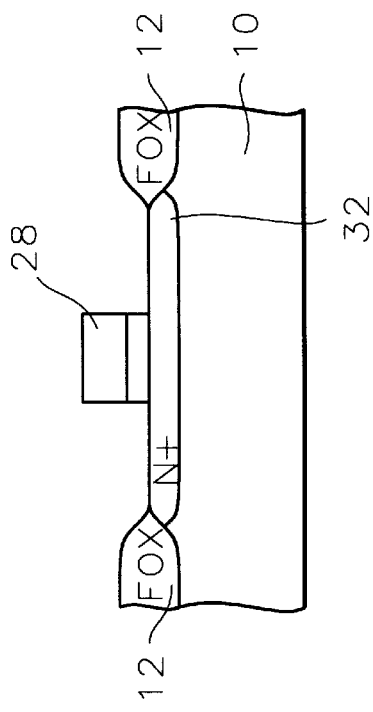

The width W, shown in FIGS. 4 and 5, should be as small as possible, between about 1 and 20 microns, and preferably smaller than 3 microns. With a minimal width W, the two N+ regions 30 will punch through to form the buried gate 32, as illustrated in FIG. 6. The channel region in the perpendicular direction, illustrated in FIG. 3, will narrow slightly during heating as implanted regions 26 diffuse. However, since the width W is made to be so narrow in the direction illustrated in FIG. 5, the diffusion of the N+ regions 30 will punch through to form a single implanted region 32 meeting under the channel region 28, as illustrated in FIG. 6.

The gate of the reversed MOSFET device illustrated in FIG. 6 includes the N+ regions 30 and the substrate region under 28; that is, 32. The gate of the reversed MOSFET device is formed during the self-aligned implant step by punch-through. No additional masking step is needed.

Figure 7:
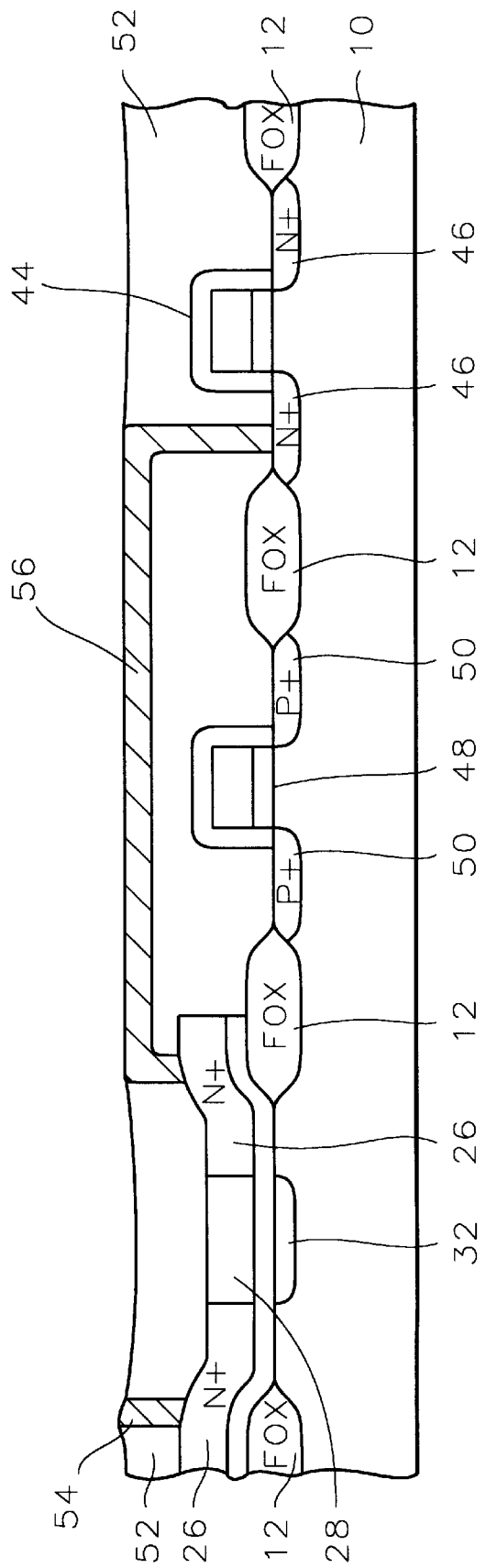

Processing continues as is conventional in the art. FIG. 7 illustrates an example of a CMOS integrated circuit device including the reversed MOS gate 32 of the present invention. An NMOS gate 44 and associated source and drain regions 46 are shown on the right hand side of the figure. A PMOS gate 48 and source and drain regions 50 are shown in the center of the figure. For example, as shown in FIG. 7, a thick insulating layer 52 of borophosphosilicate glass (BPSG), or the like, is blanket deposited over the substrate and the gates 28, 44, and 48. Contact openings are etched through the insulating layer to the source and drain regions to be contacted. A conducting layer 54 is deposited within the contact openings and patterned to complete the electrical connections in the fabrication of the integrated circuit device. For example, conducting line 56 forms a gate contact between the drain 26 of the reversed MOS device and the source 40 of the NMOS device.

It will be understood by those skilled in the art that the CMOS structure illustrated in FIG. 7 is an example only. Many other possible integrated circuit structures and electrical connections are possible, depending on circuit design and usage. The process of the present invention for making a self-aligned reverse MOS device can be used in any suitable application.

The process of the invention provides an effective and very manufacturable method for fabricating a reversed MOS structure which can be implemented within the conventional CMOS process. Other reversed MOS processes, such as that discussed in the book by Weste et al, require a double polysilicon process and an extra masking step. The process disclosed in Yang's patent requires an additional masking step to form the gate within the substrate. The process of the present invention forms the reversed MOS gate region during the self-aligned implant step; no extra mask is needed to form the gate.

The reversed MOS structure of the present invention provides latchup immunity. When mixed with traditional MOS transistors, device density can be increased and chip size can therefore be decreased.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

provided an active area in a semiconductor substrate separated from other active areas by isolation regions;

forming a dielectric layer on the surface of said semiconductor substrate in said active area;

depositing a polysilicon layer overlying said dielectric layer and patterning said polysilicon layer;

forming a mask over a portion of said polysilicon layer in said active area; and implanting ions into said polysilicon layer not covered by said mask to form implanted regions within said polysilicon layer and simultaneously form implanted regions within said semiconductor substrate adjacent to said polysilicon layer wherein said implanted regions within said polysilicon layer form source and drain regions and wherein said polysilicon layer covered by said mask forms a channel region and wherein said implanted regions within said substrate diffuse together to form a gate electrode underlying said channel region.

2. The method according to claim 1 wherein said dielectric layer comprises silicon oxide and has a thickness of between about 60 and 150 Angstroms.

3. The method according to claim 1 wherein said polysilicon layer has a thickness of between about 2000 and 4000 Angstroms.

4. The method according to claim 1 wherein said step of implanting said ions comprises implanting Arsenic ions at an energy of 30 to 50 KeV and dosage of 1 E 13 to 3 E 15 atoms/cm$^2$ to form N+ implanted regions.

5. The method according to claim 1 wherein said step of implanting said ions comprises implanting Phosphorus ions at an energy of 20 to 30 KeV and dosage of 1 E 13 to 3 E 15 atoms/cm$^2$ to form N+ implanted regions.

6. The method according to claim 1 wherein said step of implanting said ions comprises implanting boron ions at an energy of 20 to 30 KeV and dosage of 1 E 13 to 3 E 15 atoms/cm$^2$ to form P+ implanted regions.

7. The method according to claim 1 wherein said step of implanting said ions comprises implanting BF$_2$ ions at an energy of 30 to 70 KeV and dosage of 1 E 13 to 3 E 15 atoms/cm$^2$ to form P+ implanted regions.

8. The method according to claim 1 wherein said channel region between said implanted regions within said semiconductor substrate has a width of between about 1 and 20 microns.

9. The method according to claim 1 wherein said channel region between said implanted regions within said semiconductor substrate has a width of less than about 3 microns.

10. A method of fabricating a reversed MOS device in the fabrication of an integrated circuit device comprising:

providing an active area in a semiconductor substrate separated from other active areas by isolation regions;

forming a dielectric layer on the surface of said semiconductor substrate in said active area;

depositing a polysilicon layer overlying said dielectric layer and patterning said polysilicon layer;

forming a mask over a portion of said polysilicon layer in said active area; and implanting ions into said polysilicon layer not covered by said mask to form implanted regions within said polysilicon layer and simultaneously form implanted regions within said semiconductor substrate adjacent to said polysilicon layer wherein said implanted regions within said polysilicon layer form source and drain regions of said reversed MOS device and wherein said polysilicon layer covered by said mask forms a channel region of said reversed MOS device and wherein said implanted regions within said substrate diffuse together to form a gate electrode of said reversed MOS device underlying said channel region.

11. The method according to claim 10 wherein said dielectric layer comprises silicon oxide and has a thickness of between about 60 and 150 Angstroms.

12. The method according to claim 10 wherein said polysilicon layer has a thickness of between about 2000 and 4000 Angstroms.

13. The method according to claim 10 wherein said step of implanting said ions comprises implanting Arsenic ions at an energy of 30 to 50 KeV and dosage of 1 E 13 to 3 E 15 atoms/cm$^2$ to form N+ implanted regions.

14. The method according to claim 10 wherein said step of implanting said ions comprises implanting Phosphorus ions at an energy of 20 to 30 KeV and dosage of 1 E 13 to 3 E 15 atoms/cm$^2$ to form N+ implanted regions.

15. The method according to claim 10 wherein said step of implanting said ions comprises implanting boron ions at an energy of 20 to 30 KeV and dosage of 1 E 13 to 3 E 15 atoms/cm$^2$ to form P+ implanted regions.

16. The method according to claim 10 wherein said step of implanting said ions comprises implanting BF$_2$ ions at an energy of 30 to 70 KeV and dosage of 1 E 13 to 3 E 15 atoms/cm$^2$ to form P+ implanted regions.

17. The method according to claim 10 wherein said channel region between said implanted regions within said semiconductor substrate has a width of between about 1 and 20 microns.

18. The method according to claim 10 wherein said channel region between said implanted regions within said semiconductor substrate has a width of less than about 3 microns.

19. A method of fabricating a reversed MOS device in the fabrication of an integrated circuit device comprising:

providing an active area in a semiconductor substrate separated from other active areas by isolation regions;

forming a dielectric layer on the surface of said semiconductor substrate in said active area;

depositing a polysilicon layer overlying said dielectric layer and patterning said polysilicon layer;

forming a mask over a portion of said polysilicon layer in said active area; and implanting ions into said polysilicon layer not covered by said mask to form implanted regions within said polysilicon layer and simultaneously form implanted regions within said semiconductor substrate adjacent to said polysilicon layer wherein said implanted regions within said polysilicon layer form source and drain regions of said reversed MOS device and wherein said polysilicon layer covered by said mask forms a channel region of said reversed MOS device and wherein the width of said channel region between said implanted regions within said substrate is between about 1 and 20 microns whereby said implanted regions within said substrate diffuse together to form a gate electrode of said reversed MOS device underlying said channel region.

20. The method according to claim 19 wherein said step of implanting said ions comprises implanting Arsenic ions at an energy of 30 to 50 KeV and dosage of 1 E 13 to 3 E 15 atoms/cm$^2$ to form N+ implanted regions.

21. The method according to claim 19 wherein said step of implanting said ions comprises implanting Phosphorus ions at an energy of 20 to 30 KeV and dosage of 1 E 13 to 3 E 15 atoms/cm$^2$ to form N+ implanted regions.

22. The method according to claim 19 wherein said step of implanting said ions comprises implanting boron ions at an energy of 20 to 30 KeV and dosage of 1 E 13 to 3 E 15 atoms/cm$^2$ to form P+ implanted regions.

23. The method according to claim 19 wherein said step of implanting said ions comprises implanting BF$_2$ ions at an energy of 30 to 70 KeV and dosage of 1 E 13 to 3 E 15 atoms/cm$^2$ to form P+ implanted regions.

24. The method according to claim 19 wherein said channel region between said implanted regions within said semiconductor substrate has a width of less than about 3 microns.

* * * * *